United States Patent
Hassanzadeh

[19]
[11] Patent Number: 5,806,179
[45] Date of Patent: Sep. 15, 1998

[54] METHOD FOR CONNECTING A CABLE TO A PRINTED CIRCUIT BOARD

[75] Inventor: Arman Hassanzadeh, Fountain Valley, Calif.

[73] Assignee: Alps Electric (USA), Inc., San Jose, Calif.

[21] Appl. No.: 603,524

[22] Filed: Feb. 20, 1996

[51] Int. Cl.⁶ .................................................. H01R 43/02
[52] U.S. Cl. ................................ 29/860; 29/858; 29/843; 228/56.3; 228/180.21
[58] Field of Search ............................ 228/180.21, 56.3; 29/843, 860, 858

[56] References Cited

U.S. PATENT DOCUMENTS

| | | | |
|---|---|---|---|
| H487 | 7/1988 | Clark et al. | 29/843 |
| 3,283,987 | 11/1966 | Kauffman | 29/843 X |
| 3,451,122 | 6/1969 | Kuhns | 29/843 X |
| 3,751,801 | 8/1973 | Praeger et al. | . |
| 4,255,853 | 3/1981 | Campillo et al. | 29/843 |
| 4,715,119 | 12/1987 | Joosten | 29/860 X |

*Primary Examiner*—Carl J. Arbes
*Attorney, Agent, or Firm*—Guy W. Shoup

[57] ABSTRACT

A cable header assembly for mounting a cable in an electronic device, the assembly including a connecting member fixedly connected to a plurality of wires of the cable such that the wires are maintained at a predetermined spacing. The connecting member includes an adhesive strip adhesively connected to the wires, an integral plastic member including a flat body and a plurality of clip portions which are snap-coupled to the wires or a heat sensitive strip which is melted onto the wires.

4 Claims, 3 Drawing Sheets

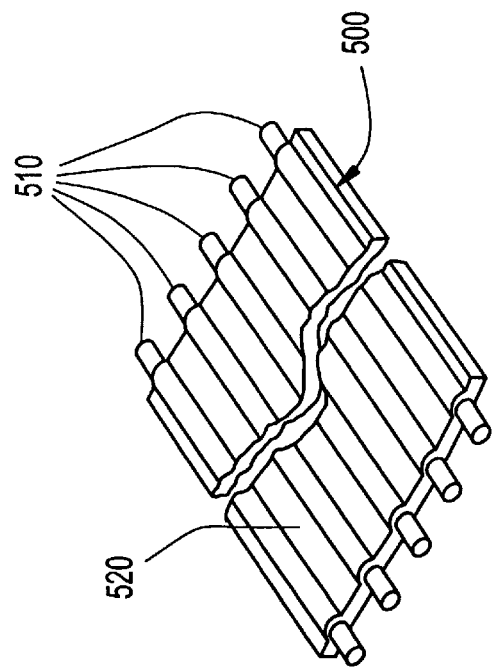
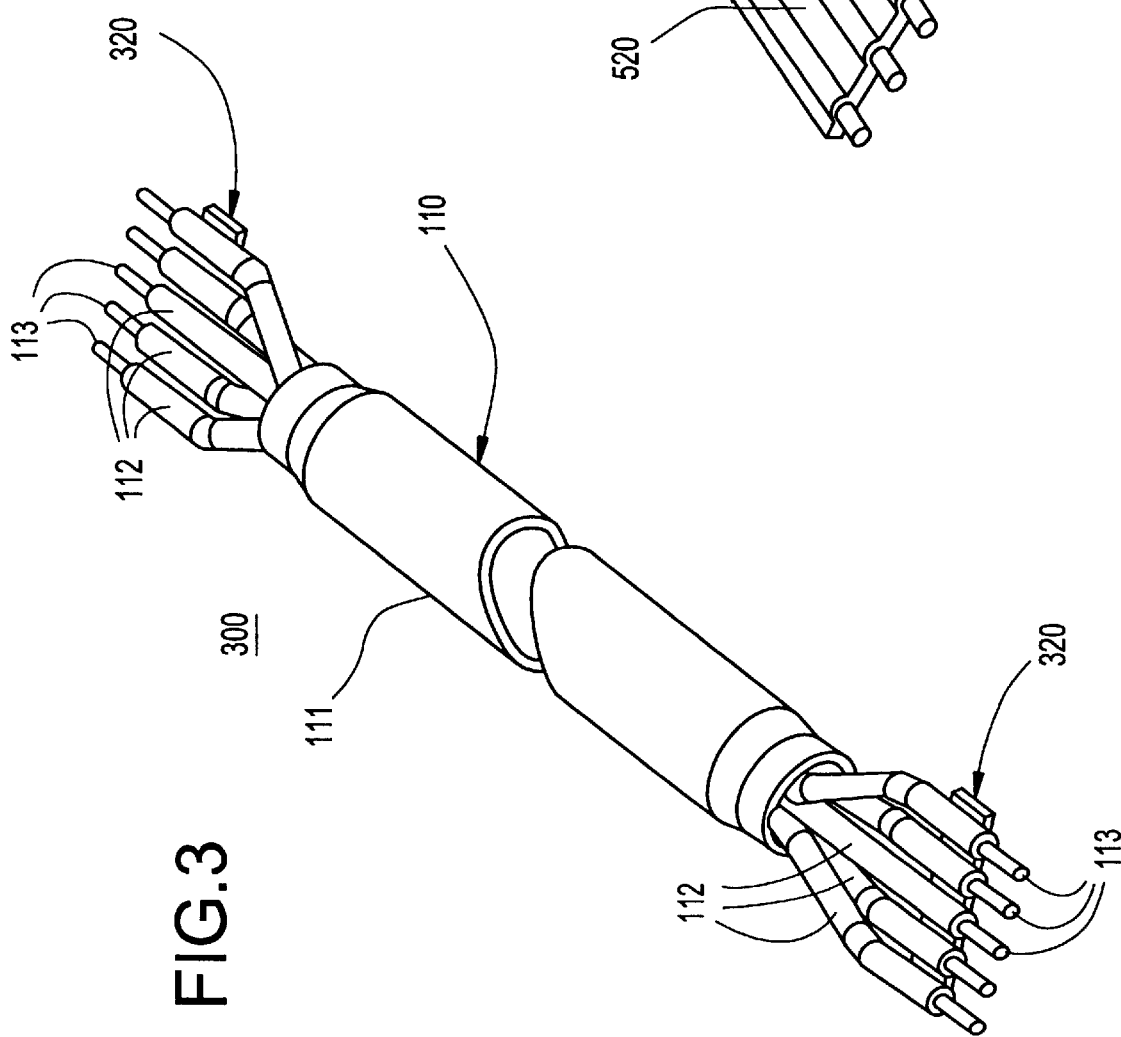

METHOD FOR CONNECTING A CABLE TO A PRINTED CIRCUIT BOARD

BACKGROUND OF THE INVENTION

1. Field of the Invention

The present invention is directed to the production of electronic devices, and more particularly is directed to a cable header assembly and a method for forming the cable header assembly.

2. Description of the Prior Art

Cables are commonly used in the production of electronic devices, such as computer mice. Common cables include a tubular insulator sheath formed around a plurality of wires. Each of the wires is covered with an insulating material to prevent electrical contact with other wires in the cable.

During production of an electronic device, the individual wires of a common cable header are separated and the insulating material is stripped to expose ends of the wires. The individual wires are then separately mounted onto the PCB by inserting the ends of the wires into predetermined holes formed in a printed circuit board (PCB) of the electronic device, and then soldering is performed to provide desired electrical connections between the wires and the conductive traces formed on the PCB.

A problem with this prior art production process is that mounting and soldering individual wires of the cable header to the PCB is labor intensive, thereby leading to high production costs.

Another problem with the prior art production process is that the wires are often mistakenly inserted and soldered into incorrect holes of the PCB, thereby producing a malfunctioning device which requires troubleshooting and reworking. The expense associated with these assembly errors significantly increases the manufacturing costs of the electronic device.

One prior art solution to the problem of handling each of the individual wires of a common cable header is to use a ribbon cable.

Referring to FIG. 5, a ribbon cable 500 includes a plurality of parallel conductors 510 held by a plastic ribbon 520. A benefit of using the ribbon cable 500 is that the conductors 510 are held at a predetermined spacing. However, ribbon cable is significantly more expensive than common cable, and the spacing of the wires of a ribbon cable often does not match the spacing of holes on the PCB of an electronic device. Further, unlike common cable, ribbon cable is typically not as easy to bend and twist such that it can be conveniently used with an electronic device. Therefore, ribbon cables are typically not used in the production of electronic devices.

What is needed is a method for maintaining the spacing between the individual wires of a common cable header such that the process of mounting and soldering the wires is significantly simplified, and which reduces the occurrences of soldering wires in the wrong holes of a PCB.

SUMMARY OF THE INVENTION

In accordance with the present invention, a cable header assembly for a common cable is provided in which the individual wires of the cable are maintained at a predetermined spacing by a connecting member, such as a plastic clip or adhesive tape. With the wires held at the predetermined spacing, mounting and soldering of the wires are greatly simplified. Further, the predetermined spacing may be set such that each of the wires is reliably aligned with a correct hole formed in a PCB of an electronic device, thereby preventing assembly errors.

In accordance with a first aspect of the present invention, the connecting member is an adhesive strip which is attached to the wires.

In accordance with a second aspect of the present invention, the connecting member is integrally formed from plastic and includes a flat body portion and a plurality of wire clips formed at a predetermined spacing on the plastic member. Each of the wire clips is a resilient plastic piece which is snap-coupled to one of the cable wires.

In accordance with a third aspect of the present invention, the connecting member is a heat sensitive strip which is melted onto the wires.

A method for producing an electronic device in accordance with the present invention includes the steps of separating the wires of a common cable, stripping the wires to expose conductive end portions, mounting the wires onto a jig which maintains the wires at a predetermined spacing, attaching a connecting member to the wires, mounting the exposed ends of the wires into holes formed in a PCB of the electronic device, and soldering the exposed ends to the PCB.

In accordance with one embodiment of the above-described method, the connecting member comprises a strip of low melting-point material, and the step of attaching the connecting member to the wires includes heating the low melting point material such that it melts and adheres to the wires.

In accordance with another embodiment of the above-described method, the connecting member comprises an adhesive strip, and the step of attaching the connecting member to the wires includes placing the wires onto a first portion of the adhesive strip, then placing a second portion of the adhesive strip onto the first portion such that the wires are sandwiched between the first and second portions.

In accordance with another embodiment of the above described method, the connecting member comprises an integral plastic piece including a flat body and a plurality of clips formed on the flat body, and the step of attaching the connecting member to the wires includes placing the wires onto the plastic piece such that the wires are snap-coupled into the clips.

BRIEF DESCRIPTION OF THE DRAWINGS

These and other features, aspects and advantages of the present invention will become better understood with regard to the following description, appending claims and accompanying drawings, where:

FIG. 3 shows a cable header assembly according to a third embodiment of the present invention;

FIG. 5 shows a prior art ribbon cable.

DESCRIPTION OF THE PREFERRED EMBODIMENT

Figure 1:
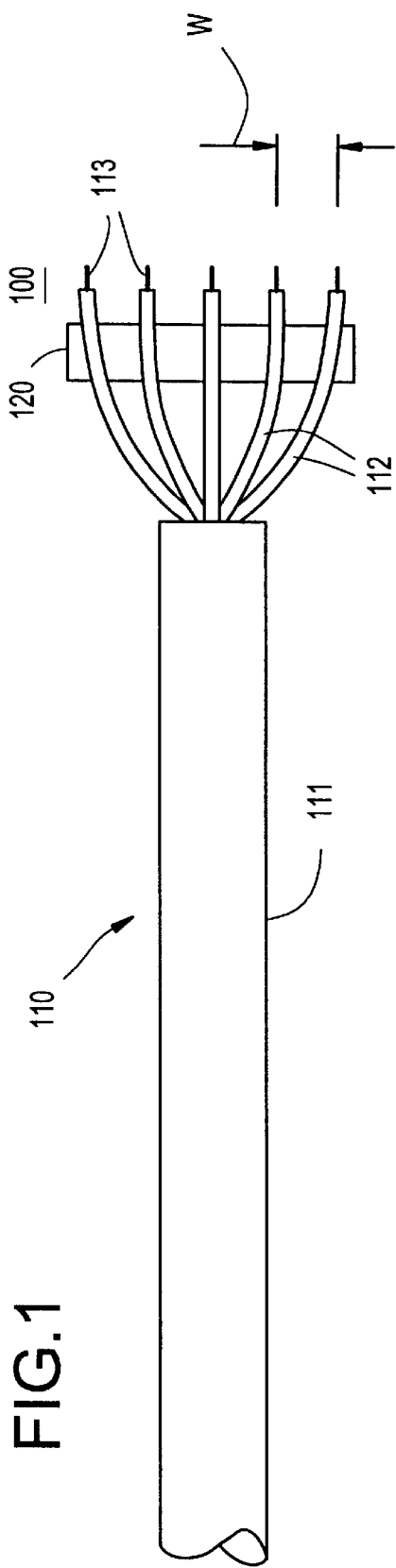
FIG. 1 shows a cable header assembly according to a first embodiment of the present invention.

Referring to FIG. 1, a cable header assembly 100 in accordance with a first embodiment of the present invention includes a cable 110 and an adhesive strip 120. The cable 110 is a common-type cable having a substantially tubular sheath 111 formed around a plurality of wires 112. Portions of the wires 112 extend through an end of the tubular sheath 111 such that they may be separated from each other. In accordance with the present invention, the wires are secured by the adhesive strip 120 at a predetermined spacing W which corresponds with the positioning of holes formed in a printed circuit board (PCB) (not shown) of an electronic device.

Figure 4:
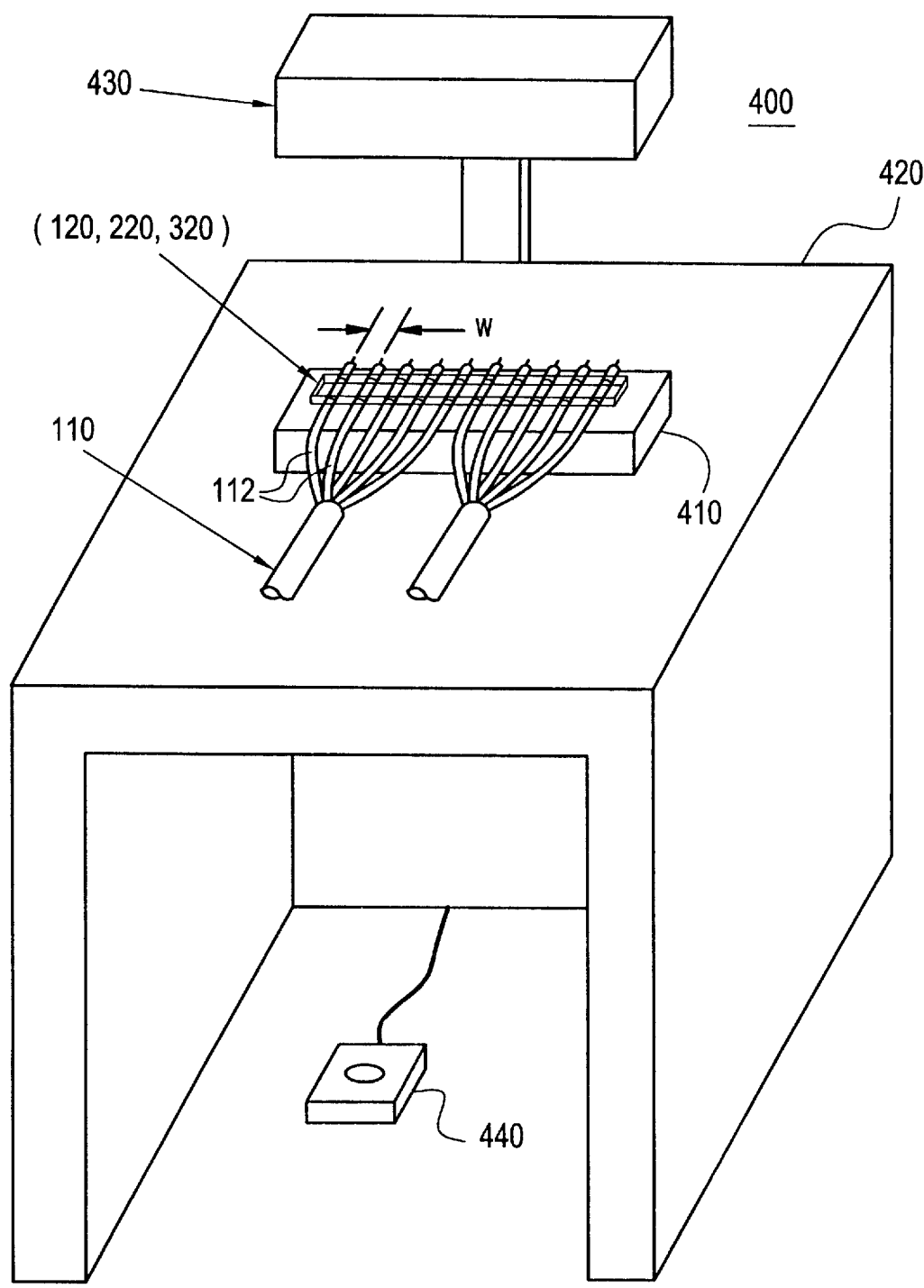
FIG. 4 shows an apparatus used to produce the cable header assembly according to the third embodiment.

FIG. 4 shows a work station 400 which is used to produce the cable header assembly 100 in accordance with the present invention. The work station 400 includes a jig 410 upon which is formed a plurality of grooves into which the wires 112 of the cable 110 are positioned during assembly. The grooves of the jig 410 are spaced at the predetermined distance W such that the wires 112 are properly spaced. The wires 112 typically include individual colors such that individual wires may be identified during the cable header assembly production process.

It is noted that the spacing W appears to be uniform between all of the wires 112 of the cable header assembly 100. However, if the holes of the PCB are irregularly spaced, the grooves formed in jig 410 may be spaced accordingly, thereby providing accurate placement of the exposed ends 113 of the wires such that they are conveniently aligned with the holes of the PCB. This provides an advantage over the use of ribbon cables in that irregular spacing is typically not available in ribbon cables, whereas the production of irregular spacing between the wires of the cable header assembly 100 may be affected simply by changing the groove spacing on the jig 410.

A method for producing the cable header assembly 100 includes cutting away a portion of the tubular sheath 111 and separating the wires 112 from each other. The wires are then stripped to expose end portions 113. A first portion of the connecting member 120 is laid along the jig 410 such that an adhesive faces upward. The wires 112 are then positioned on the jig in the predetermined order, and a second portion of the connecting member 120 is laid over the wires such that the second portion and first portion sandwich the wires therebetween. The adhesive of the first and second portions maintain the wires in the predetermined spacing W. The excess end portions of the connecting member 120 are then trimmed and the cable header assembly 100 is ready for mounting onto the PCB of an electronic device. During mounting, the exposed portions 113 of the wires 112 are inserted into holes formed in the PCB of the electronic device and the exposed end portions are then soldered to contact the wires with the conductive traces of the PCB.

Figure 2:
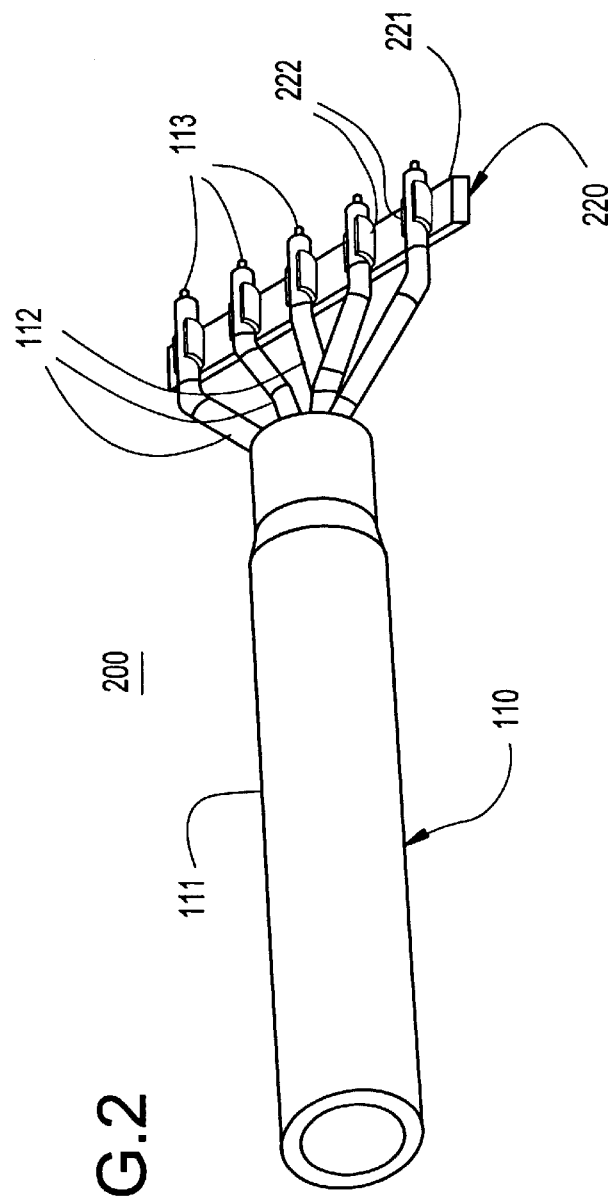
FIG. 2 shows a cable header assembly according to a second embodiment of the present invention.

FIG. 2 shows a cable header assembly 200 in accordance with a second embodiment of the present invention. The cable header assembly 200 includes a connected member 220 having a flat plastic body in the form of a strip, and a plurality of fastening portions 222 formed along with the flat plastic body 221. The connecting member 200 is preferably an integral plastic part, but may comprise fastening portions 222 which are attached by adhesive or other means to the flat plastic strip 221. As indicated in FIG. 2, the fastening portions 222 are separated by a predetermined spacing such that the wires 112 of the cable 110, when held by the fastening portions 222, are maintained at the predetermined spacing. In a preferred embodiment, the fastening portions 222 are plastic clips which are snap-coupled onto the wires 112. Alternatively, the fastening portions 222 may be cylinders through which the wires 112 extend.

An advantage of the cable header assembly 200 is provided in that the connecting member 220 may be removed from the wires 112 after assembly onto the PCB of an electronic device.

Another benefit of the cable header assembly 200 is that the wires may be mounted onto the clip portions 222 of the connecting member 220 without the need for forming grooves in the jig 410 (see FIG. 4). However, it is noted that the wires may be laid in the grooves of the jig 410 at the predetermined spacing prior to mounting the connecting member 220.

FIG. 3 shows a cable header assembly 300 in accordance with a third embodiment of the present invention. The cable header assembly 300 includes a heat sensitive member 320 which is melted onto the wires 112 of the cable 100. The heat sensitive material is preferably polyvinyl chloride (PVC), but may be any other material which bonds to the insulating material covering the wires 112 when melted.

Referring to FIG. 4, during production of the cable header assembly 300, the wires 112 are laid onto the grooves of the jig 410 at the predetermined spacing, then the heat sensitive connecting 320 is laid across the top of the wires 112. An operator then manipulates a mechanism, such as foot pedal 440 and a heat generating member 430 descends on top of the heat sensitive connecting member 320, thereby causing the heat sensitive connecting member 320 to melt onto the wires 112.

Although the present invention has been described in considerable detail with reference to certain preferred embodiments thereof, other embodiments are possible. For example, the adhesive connecting member 120 may include a single-sided or double-sided adhesive tape. In addition, several other types of connecting members may be used to maintain the wires at the predetermined spacing. Therefore, the spirit and scope of the appended claims should not be limited to the description of the preferred embodiments contained herein.

We claim:

1. A method for connecting a cable to a printed circuit board of an electronic device, the cable including a tubular sheath housing a plurality of wires, the method comprising the steps of:

separating portions of the plurality of wires;

stripping ends of the separated portions;

mounting the portions of the plurality of wires onto a jig such that the portions are maintained at a predetermined spacing;

attaching a connecting member to the portions of the plurality of wires;

mounting the stripped ends of the wires into holes formed in the printed circuit board of the electronic device; and soldering the exposed ends to the printed circuit board.

2. The method according to claim 1, wherein the connecting member comprises an adhesive strip, and wherein the step of attaching comprises placing the portions of the plurality of wires onto a first portion of the adhesive strip, then placing a second portion of the adhesive strip onto the first portion such that the portions of the plurality of wires are sandwiched between the first and second portions of the adhesive strip.

3. The method according to claim 1, wherein the connecting member comprises an integral plastic member including a flat body and a plurality of fastening portions, and the step of attaching the connecting member to the portions of the plurality of wires includes placing the portions onto the plastic piece such that the portions are held by the fastening portions.

4. The method according to claim 1, wherein the connecting member comprises a heat sensitive strip, and the step of attaching the connecting member to the portions of the plurality of wires includes heating the low melting point material such that it melts and adheres to the portions.

* * * * *